United States Patent
Kenney et al.

(10) Patent No.: US 11,444,746 B1
(45) Date of Patent: Sep. 13, 2022

(54) PHASING DETECTION OF ASYNCHRONOUS DIVIDERS

(71) Applicant: Analog Devices, Inc., Wilmington, MA (US)

(72) Inventors: John Kenney, West Windsor, NJ (US); Robert Schell, Chatham, NJ (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/303,757

(22) Filed: Jun. 7, 2021

(51) Int. Cl.
| | |
|---|---|
| H03D 3/24 | (2006.01) |
| H04L 7/00 | (2006.01) |
| H03L 7/099 | (2006.01) |
| H03L 7/08 | (2006.01) |
| H03K 21/08 | (2006.01) |

(52) U.S. Cl.
CPC ........... *H04L 7/0008* (2013.01); *H03K 21/08* (2013.01); *H03L 7/0807* (2013.01); *H03L 7/0995* (2013.01)

(58) Field of Classification Search
CPC ... H04L 7/0008; H03L 7/0995; H03L 7/0807; H03L 7/0816; H03K 21/08; H03M 1/68
USPC ............. 375/355, 373, 375, 326, 257, 258
See application file for complete search history.

(56) References Cited

U.S. PATENT DOCUMENTS

| | | | |
|---|---|---|---|
| 5,761,255 A | 6/1998 | Shi | |
| 6,137,336 A * | 10/2000 | Baba | ............. H03L 7/0816 327/295 |
| 6,445,252 B1 | 9/2002 | Eilken et al. | |
| 7,366,271 B2 | 4/2008 | Kim et al. | |
| 7,409,031 B1 | 8/2008 | Lee et al. | |

(Continued)

FOREIGN PATENT DOCUMENTS

| | | |
|---|---|---|
| CN | 103168424 B | 11/2016 |
| EP | 1753137 B1 | 9/2015 |

(Continued)

OTHER PUBLICATIONS

Hauenschild et al., "A Plastic Packaged 10 Gb/s BiCMOS Clock and Data Recovering 1 : 4-Demultiplexer with External VCO" IEEE Journal of Solid-State Circuits, vol. 31, No. 12, dated Dec. 1996, in 4 pages.

(Continued)

*Primary Examiner* — Phuong Phu
(74) *Attorney, Agent, or Firm* — Knobbe, Martens, Olson & Bear, LLP

(57) ABSTRACT

Apparatus and methods for phasing detection of asynchronous dividers are provided herein. In certain embodiments, a clock and data recovery system includes a first divider that outputs a first divided clock signal, a second divider that outputs a second divided clock signal, and an asynchronous clock phasing detection circuit that generates a detection signal indicating a relative phase difference between the first divided clock signal and the second divided clock signal. The asynchronous clock phasing detection circuit includes a quantization and logic circuit that generates an output signal indicating when the first divided clock signal and the second divided clock signal are in different states, an oscillator that outputs a control clock signal, a first counter controlled by the control clock signal and configured to count the output signal, and a control circuit that processes a first count signal from the first counter to generate the detection signal.

20 Claims, 11 Drawing Sheets

(56) References Cited

U.S. PATENT DOCUMENTS

| | | |
|---|---|---|
| 7,668,271 B2 | 2/2010 | Kim et al. |
| 7,884,674 B2 | 2/2011 | Chen et al. |
| 8,170,168 B2 | 5/2012 | Oshima |
| 8,687,756 B2 | 4/2014 | Sindalovsky et al. |
| 9,559,705 B1 | 1/2017 | Chang et al. |
| 9,577,815 B1 | 2/2017 | Simpson et al. |
| 10,644,706 B1 | 5/2020 | Kim et al. |
| 2010/0027711 A1* | 2/2010 | Manku .................. H03M 1/68 375/295 |
| 2010/0090737 A1 | 4/2010 | Watanabe et al. |

FOREIGN PATENT DOCUMENTS

| | | |
|---|---|---|
| JP | 5827354 B2 | 12/2015 |
| KR | 101109198 B1 | 1/2012 |

OTHER PUBLICATIONS

Mansuri et al., "An On-Die All-Digital Delay Measurement Circuit with 250fs Accuracy" 2012 Symposium on VLSI Circuits (VLSIC), IEEE Xplore dated Jul. 19, 2012, in 2 pages.

\* cited by examiner

CK1 HAS 8 STATES RELATIVE TO CK0

PHASING DETECTION OF ASYNCHRONOUS DIVIDERS

FIELD OF THE DISCLOSURE

Embodiments of the invention relate to electronics, and more particularly, to electronic timing systems.

BACKGROUND

Clock and data recovery (CDR) systems can be used in a variety of applications for recovering data from a high-speed serial data stream. CDR systems can be used in, for example, telecommunications systems, optical networks, and chip-to-chip communication.

A CDR system can use a data sampling clock signal to capture data samples from the serial data stream, and an edge sampling clock signal to capture edge samples from the serial data stream. To aid in providing deserialization, retiming, and/or other functions, both the data sampling clock signal and the edge sampling clock signal can be divided for use downstream.

SUMMARY OF THE DISCLOSURE

Apparatus and methods for phasing detection of asynchronous dividers are provided herein. In certain embodiments, a CDR system includes a first divider that outputs a first divided clock signal, a second divider that outputs a second divided clock signal, and an asynchronous clock phasing detection circuit that generates a detection signal indicating a relative phase difference between the first divided clock signal and the second divided clock signal. The asynchronous clock phasing detection circuit includes a quantization and logic circuit that generates an output signal indicating when the first divided clock signal and the second divided clock signal are in different states, an oscillator that outputs a control clock signal, a first counter controlled by the control clock signal and configured to count the output signal, and a control circuit that processes a first count signal from the first counter to generate the detection signal. In certain implementations, the asynchronous clock phasing detection circuit further incudes a second counter that counts a number of cycles of the control clock signal to provide the control circuit with a basis for comparing the first count signal.

In one aspect, a clock and data recovery (CDR) system is provided. The CDR system includes a first divider configured to output a first divided clock signal, a second divider configured to output a second divided clock signal, and an asynchronous clock phasing detection circuit includes a quantization and logic circuit configured to process the first divided clock signal and the second divided clock signal to generate an output signal indicating when the first divided clock signal and the second divided clock signal are in different states, an oscillator configured to output a control clock signal, a first counter controlled by the control clock signal and configured to count the output signal, and a control circuit configured to process a first count signal from the first counter to generate a detection signal indicating a relative phasing between the first divided clock signal and the second divided clock signal.

In another aspect, a method of asynchronous clock phasing detection is provided. The method includes dividing a first clock signal to generate a first divided clock signal using a first divider, dividing a second clock signal to generate a second divided clock signal using a second divider, generating an output signal indicating when the first divided clock signal and the second divided clock signal are in different states, generating a first count signal by counting the output signal based on timing of a control clock signal using a first counter, and generating a detection signal indicating a relative phasing between the first divided clock signal and the second divided clock signal based on the first count signal.

In another aspect, an asynchronous clock phasing detection circuit is provided. The asynchronous clock phasing detection circuit includes a quantization and logic circuit configured to process a first divided clock signal and a second divided clock signal to generate an output signal indicating when the first divided clock signal and the second divided clock signal are in different states, an oscillator configured to output a control clock signal, a first counter controlled by the control clock signal and configured to count the output signal, and a control circuit configured to process a first count signal from the first counter to generate a detection signal indicating a relative phasing between the first divided clock signal and the second divided clock signal.

DETAILED DESCRIPTION OF EMBODIMENTS

Figure 1A:
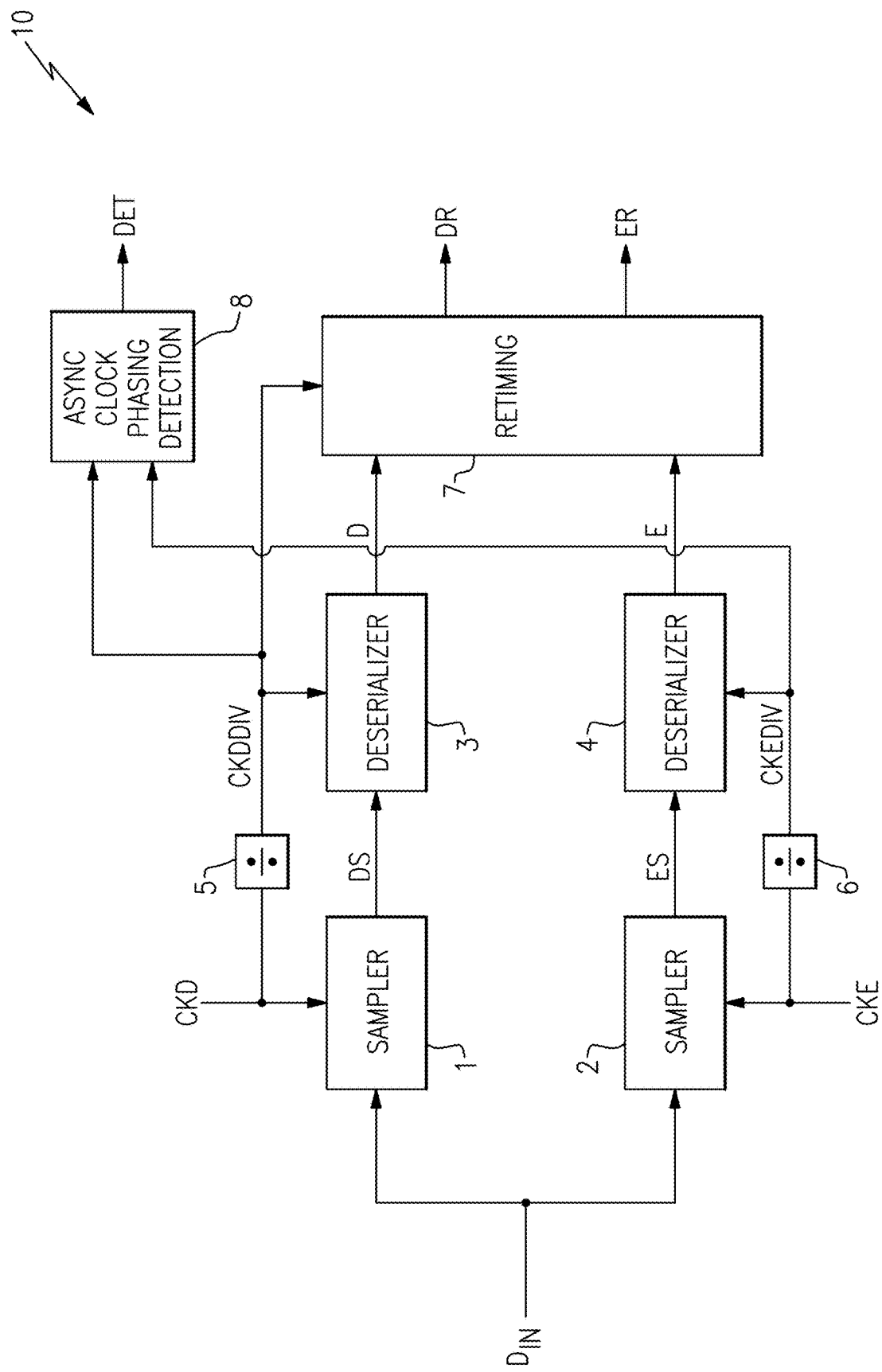
FIG. 1A is a schematic diagram of a clock and data recover (CDR) system according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Digital bits are often timed on multiple clock domains in clock and data recovery (CDR) systems. In one example, a CDR system uses binary phase detectors to sample a non-return-to-zero (NRZ) data stream using a data sampling clock signal in the center of the bit period and an edge sampling clock signal at the edge of the bit period. In such a system, the edge sampling clock signal can be delayed by a half bit period relative to the data sampling clock signal. When operating at 56 Gs/s, the bit period is approximately 17.9 ps, and thus transitions of the edge sampling clock signal trail transitions of the data sampling clock signal by less than 9 ps.

To reduce the word rate, the sampled data can be processed by deserializer stages to achieve a decreased data rate suitable for processing by synthesized digital logic. To achieve such deserialization, samples captured by the data sampling clock signal and the edge sampling clock signal can be individually deserialized by a factor of 2 after initial sampling. Additionally, each deserializer can operate using a divided clock signal generated by a divide-by-2 asynchronous divider, for instance, implemented as a toggle flip-flop. The relative phases of the divide-by-2 asynchronous dividers can start in one of two possible states, where only one is correct for operation of the CDR system.

Absent a mechanism to detect for and correct the relative phasing of asynchronous dividers, such as those used in the CDR system described above, deserialized bits captured from the data sampling clock domain may be improperly shifted with respect to deserialized bits captured from the edge sampling clock domain.

Apparatus and methods for phasing detection of asynchronous dividers are provided herein. In certain embodiments, a CDR system includes a first divider that outputs a first divided clock signal, a second divider that outputs a second divided clock signal, and an asynchronous clock phasing detection circuit that generates a detection signal indicating a relative phase difference between the first divided clock signal and the second divided clock signal. The asynchronous clock phasing detection circuit includes a quantization and logic circuit that generates an output signal indicating when the first divided clock signal and the second divided clock signal are in different states, an oscillator that outputs a control clock signal, a first counter controlled by the control clock signal and configured to count the output signal, and a control circuit that processes a first count signal from the first counter to generate the detection signal. In certain implementations, the asynchronous clock phasing detection circuit further incudes a second counter that counts a number of cycles of the control clock signal to provide the control circuit with a basis for comparing the first count signal.

For example, a ratio of the first count signal to the second count signal can be used by the control circuit detect the relative phasing between the first divided clock signal and the second divided clock signal. When the divided clock signals are determined to have incorrect phasing, a variety of correction mechanisms can be performed including, but not limited to, controlling a state of the first divider and/or second divider. In one example, the dividers provide division by 2, and a polarity of one of the first divider or the second divider can be selectively inverted based on the detection signal to achieve the desired phasing.

FIG. 1A is a schematic diagram of a CDR system 10 according to one embodiment. The CDR system 10 includes a data sampler 1, an edge sampler 2, a data sample deserializer 3, an edge sample deserializer 4, a data sampling clock divider 5, an edge sampling clock divider 6, a retiming circuit 7, and an asynchronous clock phasing detection circuit 8.

Although the CDR system 10 of FIG. 1A illustrates one application for asynchronous clock phasing detection, the teachings herein are applicable to a wide variety of applications. Accordingly, the asynchronous clock phasing detection circuits disclosed herein can be used in other implementations of electronic systems.

As shown in FIG. 1A, the CDR system 10 receives a serial data stream $D_{IN}$. Additionally, the data sampler 1 generates data samples DS by sampling the serial data stream $D_{IN}$ based on timing of a data sampling clock signal CKD, while the edge sampler 2 generates edge samples ES by sampling the serial data stream $D_{IN}$ based on timing of an edge sampling clock signal CKE.

The serial data stream $D_{IN}$ can include a string of serial data bits that transition at a data rate. At a given data rate, the serial data stream $D_{IN}$ has a unit interval (UI), or average time interval between transitions of the serial data stream $D_{IN}$. The samples of the serial data stream $D_{IN}$ taken by the CDR system 10 can include not only data samples, but also edge samples used to lock the CDR system 10 to the serial data stream $D_{IN}$. When the CDR system 10 is in a locked condition, the samples can be taken from specific positions into the UI of the serial data stream $D_{IN}$.

With continuing reference to FIG. 1A, the data sampling clock divider 5 divides the data sampling clock signal CKD to generate a divided data clock signal CKDDIV, while the edge sampling clock divider 6 divides the edge sampling clock signal CKE to generate a divided edge clock signal CKEDIV. The divisor of the data sampling clock divider 5 and the edge sampling clock divider 6 can have a wide variety of values, for instance, an integer that is 2 or more. In certain implementations, the divisor is a power of two, for instance, 2, 4, 8, or 16.

The divided data clock signal CKDDIV and the divided edge clock signal CKEDIV can be used for a wide variety of functions in the CDR system 10. For example, in the illustrated embodiment, the divided edge clock signal CKEDIV is used by the edge deserializer 4 to process the edge samples ES to generate deserialized edge samples E. Additionally, divided data clock signal CKDDIV is used by the data deserializer 3 to process the data samples DS to generate deserialized data samples D. The divided data clock signal CKDDIV is also used by the retiming circuit 7 to retime the deserialized data samples D and the deserialized edge samples E to generate retimed data samples DR and retimed edge samples ER, respectively.

In the illustrated embodiment, the divided data clock signal CKDDIV and the divided edge clock signal CKEDIV are provided to the asynchronous clock phasing detection circuit 8 to generate a detection signal DET indicating a phasing difference between the divided clock signals.

The detection signal DET can be used for a wide variety of functions including, but not limited to, controlling a state of the data sampling clock divider 5 and/or the edge sampling clock divider 6. For example, the detection signal DET outputted from the asynchronous clock phasing detection circuit 8 can be used to set one or more of the dividers to a desired state to ensure proper operation of the CDR system 10. Such state control can include, but is not limited to, flipping a polarity of a divided clock signal outputted from the divider.

Absent such state control, the dividers can operate with an unknown state that can lead to the divided data clock signal CKDDIV and the divided edge clock signal CKEDIV having an undesirable phase difference that can lead to inoperability of the CDR system 10.

Figure 1B:
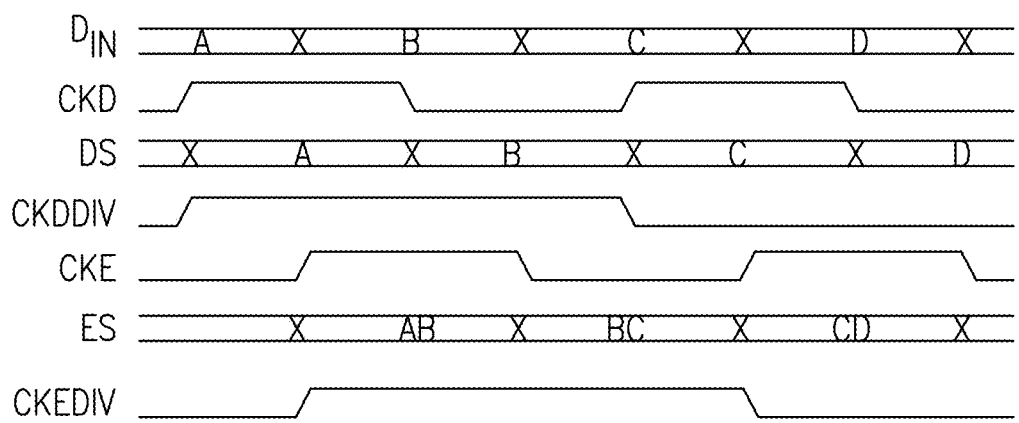
FIG. 1B is one example of a timing diagram for the CDR system of FIG. 1A.

FIG. 1B is one example of a timing diagram of clock division for the CDR system 10 of FIG. 1A in which half-rate sampling is used. The timing diagram includes plots for the serial data stream $D_{IN}$, the data samples DS, the data sampling clock signal CKD, the divided data clock signal CKDDIV (for the case of divide by two), the edge samples ES, the edge sampling edge clock signal CKE, and the divided edge clock signal CKEDIV (for the case of divide by two). In the example of FIG. 1B, the data sampling clock signal CKD and the edge sampling clock signal CKE operate at half the rate of the serial data stream $D_{IN}$.

As shown in FIG. 1B, the data samples DS include samples A, B, C, and D captured at different time instances. Additionally, the edge samples ES includes samples AB, BC, and CD.

In this example, the edge sampling clock signal CKE is offset in phase from the data sampling clock signal CKD by 90 degrees at the clock rate of the data sampling clock signal CKD. Other phase differences (for instance, 45 degrees) are also possible.

The divided data sampling clock signal CKDDIV and the divided edge sampling clock signal CKEDIV can have a particular timing needed for operation of the CDR system 10. For instance, in one example the divided edge sampling clock signal CKEDIV is desired to transition HIGH/LOW on the falling edge of the edge sampling clock signal CKE immediately after the divided data sampling clock signal CKDDIV transitions HIGH/LOW.

Such restrictions for timing can arise for a variety of reasons. For instance, in the case of a binary phase detector, edge samples are taken at the edge of the data eye. Thus, the first edge bit can be either an A or a B. The second edge bit could be either a B or a C. The sequence for the first set of deserialized bits in this example is DOUT[1:0]={A, B} with EOUT[1:0]={AB, BC}. In a binary phase detector, or early late detector, the following logic can be implemented on EOUT[1]: LATE=DOUT[1]⊕EOUT[1]=A⊕AB, and EARLY=DOUT[0]⊕EOUT[1]=BβAB.

However, if the divided edge sampling clock signal CKEDIV is inverted, the logic for the next sample becomes LATE=DOUT[1]⊕EOUT[1]=C⊕AB, and EARLY=DOUT[0]⊕EOUT[1]=D⊕BC. Note that the edge bit AB no longer falls between A and B, but between B and C. It is now delayed by one which would confuse the binary phase detector, and thus this timing would be incorrect.

Figure 1C:
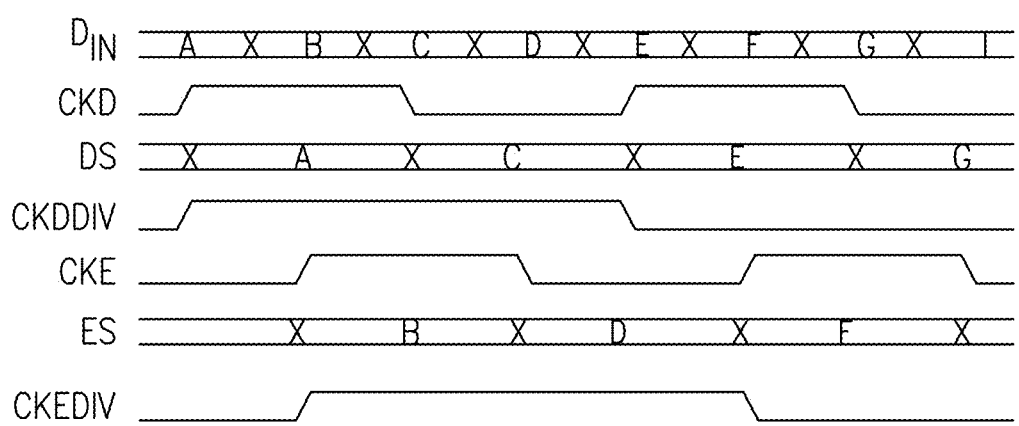
FIG. 1C is another example of a timing diagram for the CDR system of FIG. 1A.

FIG. 1C is another example of a timing diagram of clock division for the CDR system 10 of FIG. 1A in which quarter-rate sampling is used. The timing diagram includes plots for the serial data stream $D_{IN}$, the data samples DS, the data sampling clock signal CKD, the divided data clock signal CKDDIV (for the case of divide by two), the edge samples ES, the edge sampling edge clock signal CKE, and the divided edge clock signal CKEDIV (for the case of divide by two). In the example of FIG. 1C, the data sampling clock signal CKD and the edge sampling clock signal CKE operate at one quarter the rate of the serial data stream $D_{IN}$.

FIGS. 1B and 1C illustrate two examples of timing for the CDR system 10 of FIG. 1A. However, the CDR system 10 of FIG. 1A can operate using a wide variety of implementations of timing.

Figure 2A:
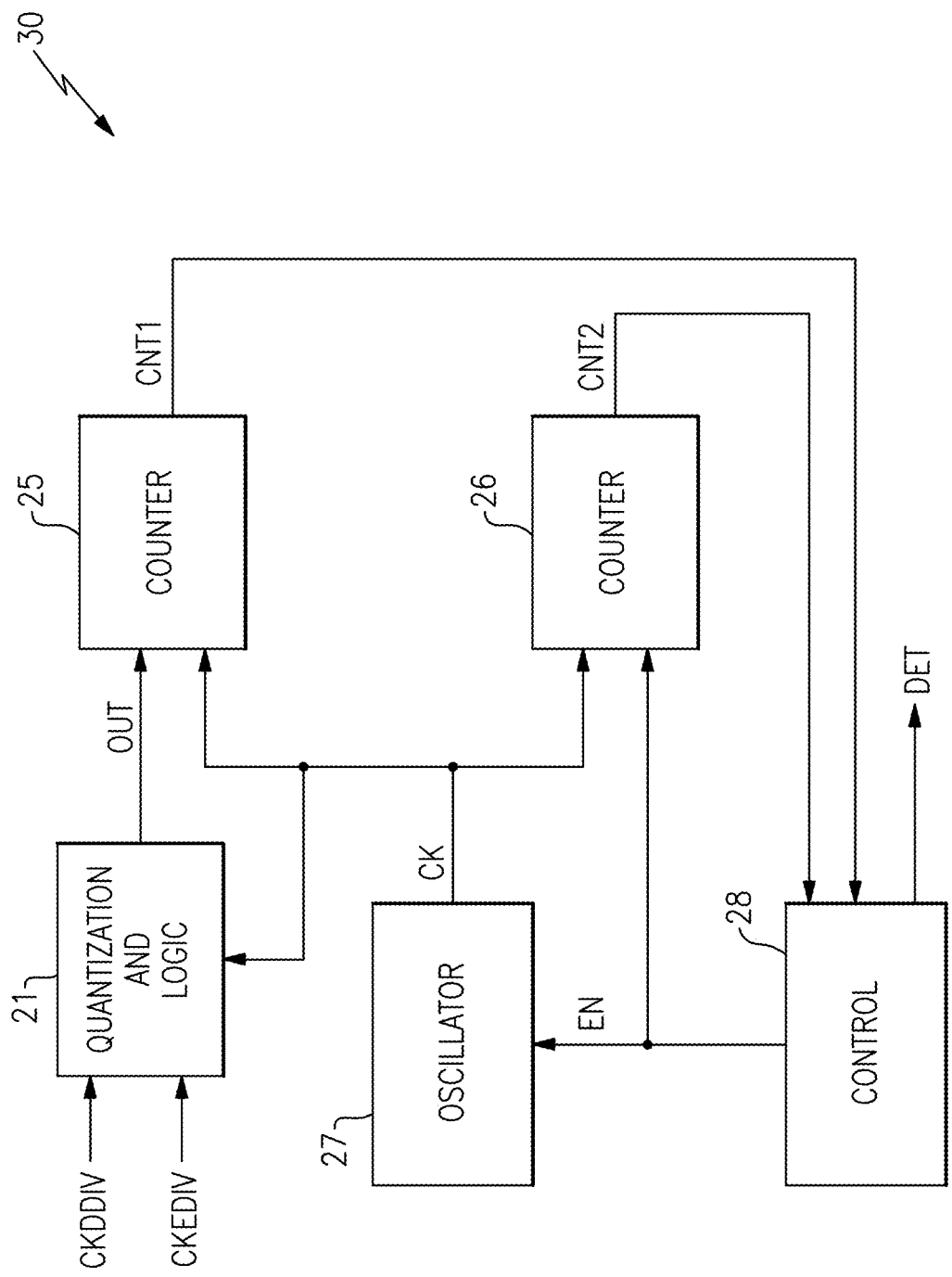
FIG. 2A is a schematic diagram of an asynchronous clock phasing detection circuit according to one embodiment.

FIG. 2A is a schematic diagram of an asynchronous clock phasing detection circuit 30 according to one embodiment. The asynchronous clock phasing detection circuit 30 includes a quantization and logic circuit 21, a first counter 25, a second counter 26, an oscillator 27, and a control circuit 28.

In the illustrated embodiment, the quantization and logic circuit 21 processes a first divided clock signal CKDDIV and a second divided clock signal CKEDIV to generate an output signal OUT indicating when the first divided clock signal CKDDIV and the second divided clock signal CKEDIV are in different states. In certain implementation, the first divided clock signal CKDDIV corresponds to a divided data sampling clock signal of a CDR system and the second divided clock signal CKEDIV corresponds to a divided edge sampling clock signal of the CDR system. For example, the asynchronous clock phasing detection circuit 30 illustrates one embodiment of the asynchronous clock phasing detection circuit 8 of FIG. 1A.

With continuing reference to FIG. 2A, the asynchronous clock phasing detection circuit 30 includes the oscillator 27 which outputs a clock signal CK provided to the control the quantization and logic circuit 21, the first counter 25, and the second counter 26. In the illustrated embodiment, the control circuit 28 provides an enable signal EN for enabling the oscillator 27. The oscillator 27 can be implemented in a wide variety of ways including, but not limited to, as a ring oscillator. In the illustrated embodiment, the control circuit 28 also provides the enable signal EN to the second counter 26. However, other implementations are possible, such as configurations in which the second counter 26 is omitted in favor of using a known period of the oscillator 27 for estimating a measurement interval of the detection circuit 30.

In response to activating the enable signal EN, the first counter 25 generates a first count signal CNT1 indicating a number of times that the output signal OUT is active over the measurement interval. Since the output signal OUT indicates when the first divided clock signal CKDDIV and the second divided clock signal CKEDIV are in different states, the value of the first count signal CNT1 indicates how often the divided clock signals have different states over the measurement interval.

With continuing reference to FIG. 2A, when the enable signal EN is activated the second counter 26 counts a number of cycles of the clock signal CK to generate a second count signal CNT2. The first count signal CNT1 and the second count signal CNT2 are processed by the control circuit 28 to generate a detection signal DET indicating a relative phasing between the first divided clock signal CKDDIV and the second divided clock signal CKEDIV.

Accordingly, in the illustrated embodiment, the first counter 25 is used to detect a number of times over a measurement interval that the output signal OUT is active (indicating that the divided clock signals have mismatched states). Based on whether or not the value of the first count signal CNT1 is high or low, the relatively phasing between the first divided clock signal CKDDIV and the second divided clock signal CKEDIV can be estimated.

To enhance the estimate of the relative phasing, the asynchronous clock phasing detection circuit 30 of FIG. 2A further includes the second counter 26 for counting the number of cycles of the clock signal CK over the measurement interval to provide a basis for evaluating the value of the first count signal CNT1. However, the teachings herein are also applicable to configurations in which the second counter 26 is omitted in favor of generating detection signal DET based on the first count signal CNT1 and an estimate of the measurement interval, for instance, based on the oscillation frequency of the oscillator 27 and the period of time that the enable signal EN is activated.

Figure 2B:
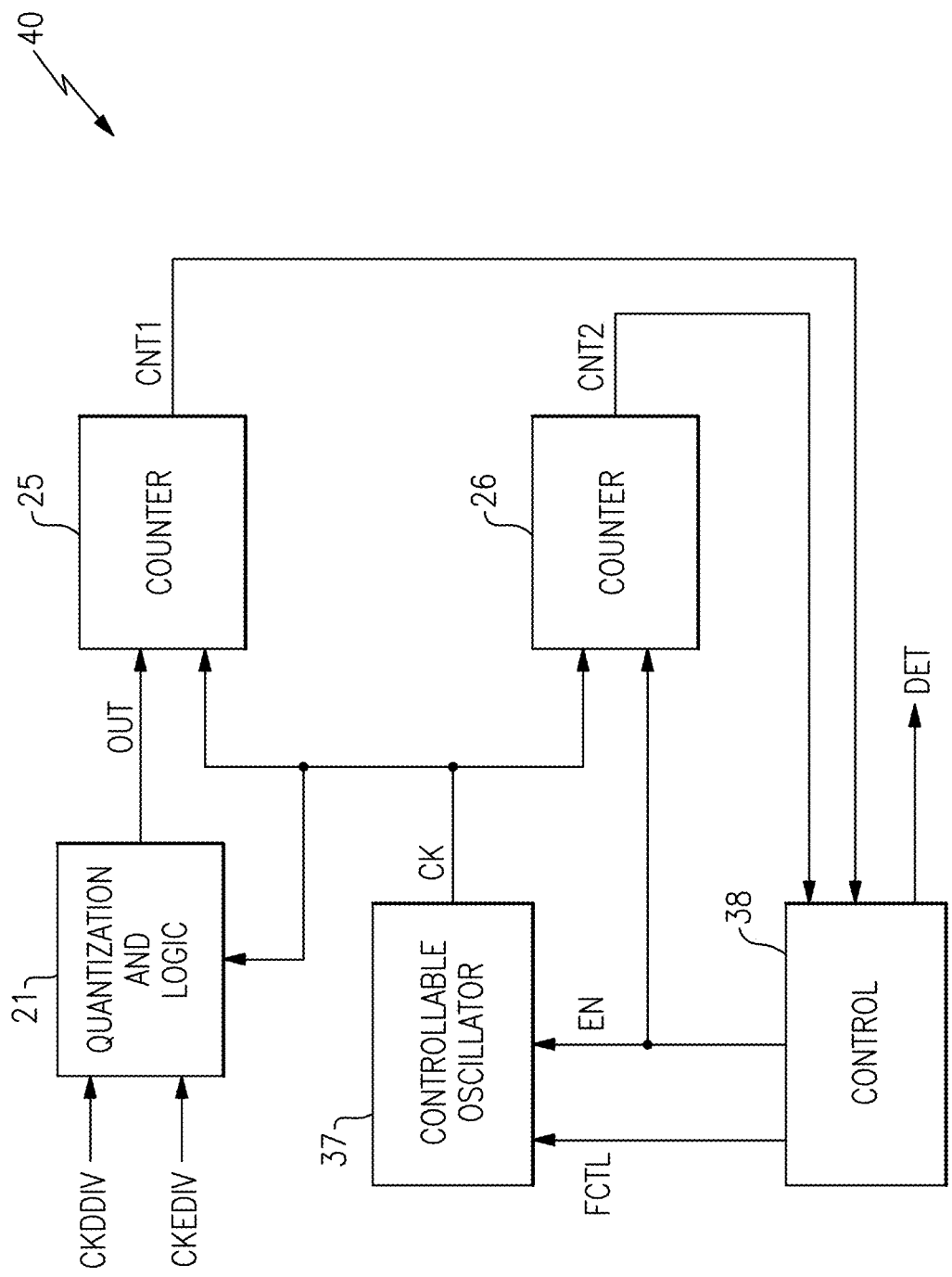
FIG. 2B is a schematic diagram of an asynchronous clock phasing detection circuit according to another embodiment.

FIG. 2B is a schematic diagram of an asynchronous clock phasing detection circuit 40 according to another embodiment. The asynchronous clock phasing detection circuit 40 includes a quantization and logic circuit 21, a first counter 25, a second counter 26, a controllable oscillator 37, and a control circuit 38.

The asynchronous clock phasing detection circuit 40 of FIG. 2B is similar to the asynchronous clock phasing detection circuit 30 of FIG. 2A, except that in the embodiment of FIG. 2B the control circuit 38 provides a frequency control signal FCTL to the controllable oscillator 37 to control an oscillation frequency of the clock signal CK.

In certain implementations, the control circuit 38 varies the frequency of the clock signal CK during the measurement interval that the enable signal EN is active. In one example, the control circuit 38 is operable to control the oscillator's clock frequency to perform a random walk (for instance, using random/pseudo-random frequency control) across the period of the divided clock signals CKDDIV and CKEDIV to obtain a measurement with enhance accuracy and reduced noise relative to a configuration using a fixed frequency of the clock signal CK.

Figure 3A:
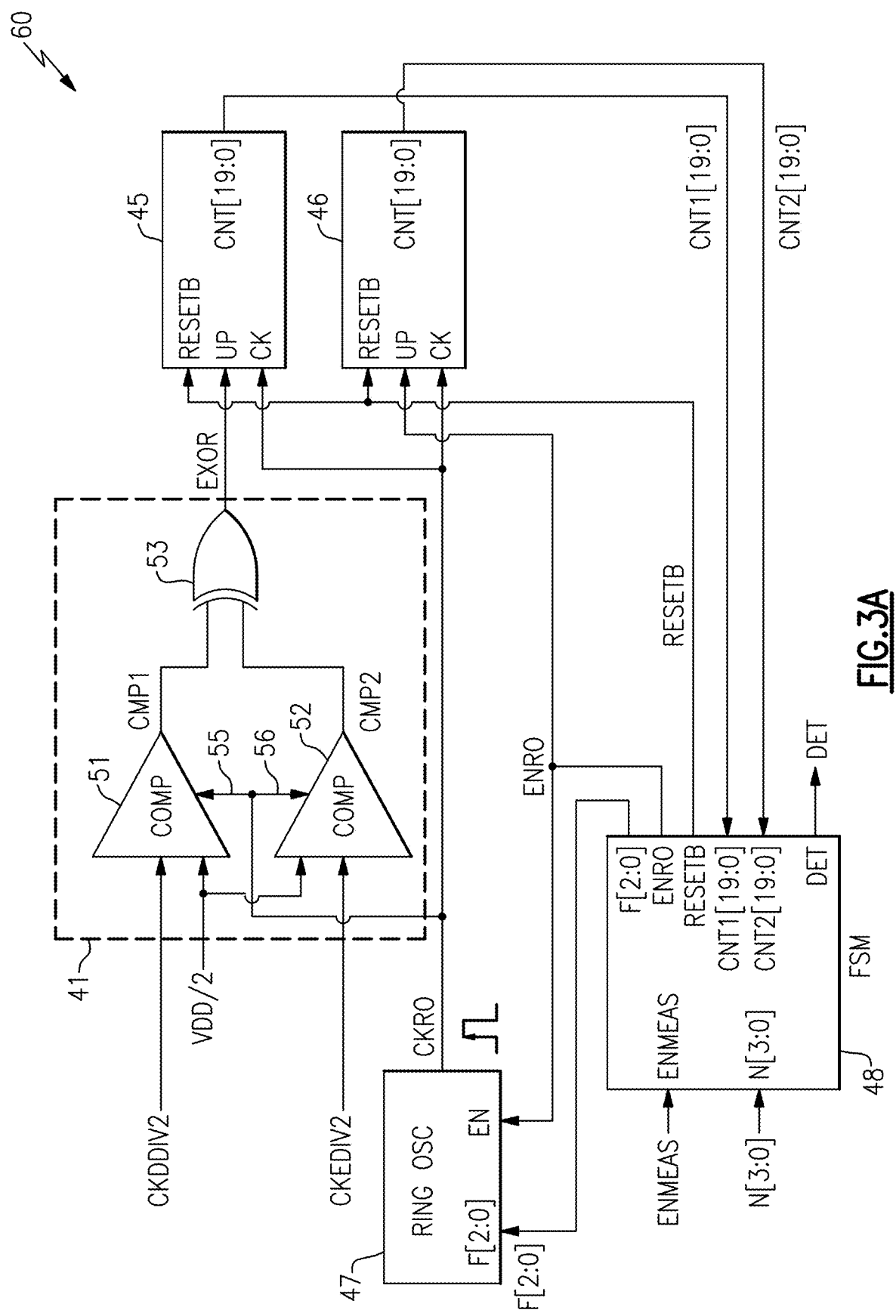
FIG. 3A is a schematic diagram of an asynchronous clock phasing detection circuit according to another embodiment.

FIG. 3A is a schematic diagram of an asynchronous clock phasing detection circuit 60 according to another embodiment. The asynchronous clock phasing detection circuit 60 includes a quantization and logic circuit 41, a first counter 45, a second counter 46, a ring oscillator 47, and a finite state machine (FSM) 48.

In the illustrated embodiment, the quantization and logic circuit 41 processes a first divided clock signal CKDDIV2 and a second divided clock signal CKEDIV2 to generate an exclusive or signal EXOR indicating when the first divided clock signal CKDDIV2 and the second divided clock signal CKEDIV2 are in different states.

In the illustrated embodiment, the quantization and logic circuit 41 includes a first comparator 51, a second comparator 52, and an XOR gate 53. However, other implementations are possible. For example, different types of quantization circuits (also referred to herein as quantizers) aside from comparators (for instance, latches) and/or different types of logic gates (for instance, a low gain AND gate) can be used.

The first comparator 51 is controlled by a ring oscillator clock signal CKRO, and generates a first comparison signal CMP1 based on comparing the first divided clock signal CKDDIV2 to a threshold signal VDD/2. Additionally, the second comparator 52 is controlled by the ring oscillator clock signal CKRO, and generates a second comparison signal CMP2 based on comparing the second divided clock signal CKEDIV2 to the threshold signal VDD/2. The XOR gate 53 generates the exclusive or signal EXOR based on performing an exclusive or operation on the first comparison signal CMP1 and the second comparison signal CMP2.

As shown in FIG. 3A, a first balanced clock signal route 55 and a second balanced clock signal route 56 are used to provide the ring oscillator clock signal CKRO to the first comparator 51 and the second comparator 52. Additionally or alternatively, the comparators 51 and 52 are implemented in close physical proximity to the dividers used to generate the first divided clock signal CKDDIV2 and the second divided clock signal CKEDIV2, respectively. Such techniques aid in enhancing high speed performance and/or measurement accuracy of the detection circuit 60.

The first counter 45 is controlled by the ring oscillator clock signal CKRO and counts the exclusive or signal EXOR to generate a first count signal CNT1[19:0], which is 20 bits in this example. The first counter 45 is also selectively reset by the FSM 48 using a reset signal RESETB. The second counter 46 is controlled by the ring oscillator clock signal CKRO and counts the enable signal ENRO provided by the FSM 48 to generate a second count signal CNT2[19:0], which is 20 bits in this example, The second count signal CNT2[19:0] indicates a number of cycles of the ring oscillator clock signal CKRO that occur over a measurement interval (corresponding to a duration that the enable signal ENRO is active, in this example). The second counter 46 is also selectively reset by the FSM 48 using the reset signal RESETB.

Thus, in this embodiment, the first divided clock signal CKDDIV2 and the second divided clock signal CKEDIV2 are quantized and thereafter applied to an exclusive or operation. In certain implementations, the divided clock signals are the outputs of asynchronous dividers for which the original clocks were offset by 90 degrees, and thus the divided clock signals are now phase-shifted by 45 degrees. When the dividers have the correct polarity, the exclusive or signal EXOR should have a 0.25/0.75 duty cycle.

As shown in FIG. 3A, the FSM 48 provides a frequency control signal F[2:0] (three bits, in this example) to control an oscillation frequency of the ring oscillator 47. In certain implementations, the FSM 48 performs a stochastic technique to generate a detection signal DET based on estimating the duty cycle of the exclusive or signal EXOR. For example, when a measurement enable signal ENMEAS is activated (for instance, transitions from LOW-to-HIGH), the reset signal RESETB and the enable signal ENRO both go HIGH. At this point, the first counter 45, the second counter 46, and the ring oscillator 47 are enabled, and the FSM 48 controls the frequency of the ring oscillator 47 (using F[2:0]) to perform a random walk across the period of the divided clocks.

With continuing reference to FIG. 3A, the second counter 46 increments on each rising edge of the ring oscillator clock signal CKRO up to a threshold set by N[3:0]. Thus, in this example, the total count is $2^{3+N[3:0]}$ (for instance, for N=9, the second counter 46 counts to 8192 at which point the enable signal ENRO goes LOW). As shown in FIG. 3A, the first counter 45 increments when the exclusive or signal EXOR is HIGH.

In one example, the exclusive or signal EXOR has a 25% duty cycle for correct polarity and 75% duty cycle for incorrect polarity. When operating with correct polarity, since the duty cycle of exclusive or signal EXOR is 25%, the average output of the first count signal CNT1[19:0] when ENRO goes LOW should be about one fourth of $2^{3+N[3:0]}$, for instance, 2048 when N[3:0]=9.

However, when the dividers have incorrect polarity in this example, the exclusive or signal has a duty cycle of 75%, and thus the average final count of the first count signal CNT1[19:0] should be about 6144. Accordingly, a threshold at $2^{3+N[3:0]}$ yields a margin of $2^{3+N[3:0]}$ to mitigate mismatches in the dividers, routing asymmetries in the quantization and logic circuit 41, and/or the distribution of edges of the ring oscillator clock signal CKRO across the period of the dividers.

The FSM 48 thus processes the first count signal CNT1[19:0] and the second count signal CNT2[19:0] to generate a detection signal DET indicating phasing between the divided clock signals. The detection signal DET can be used to correct a state of the dividers used to generate the divided clock signals.

Figure 3B:
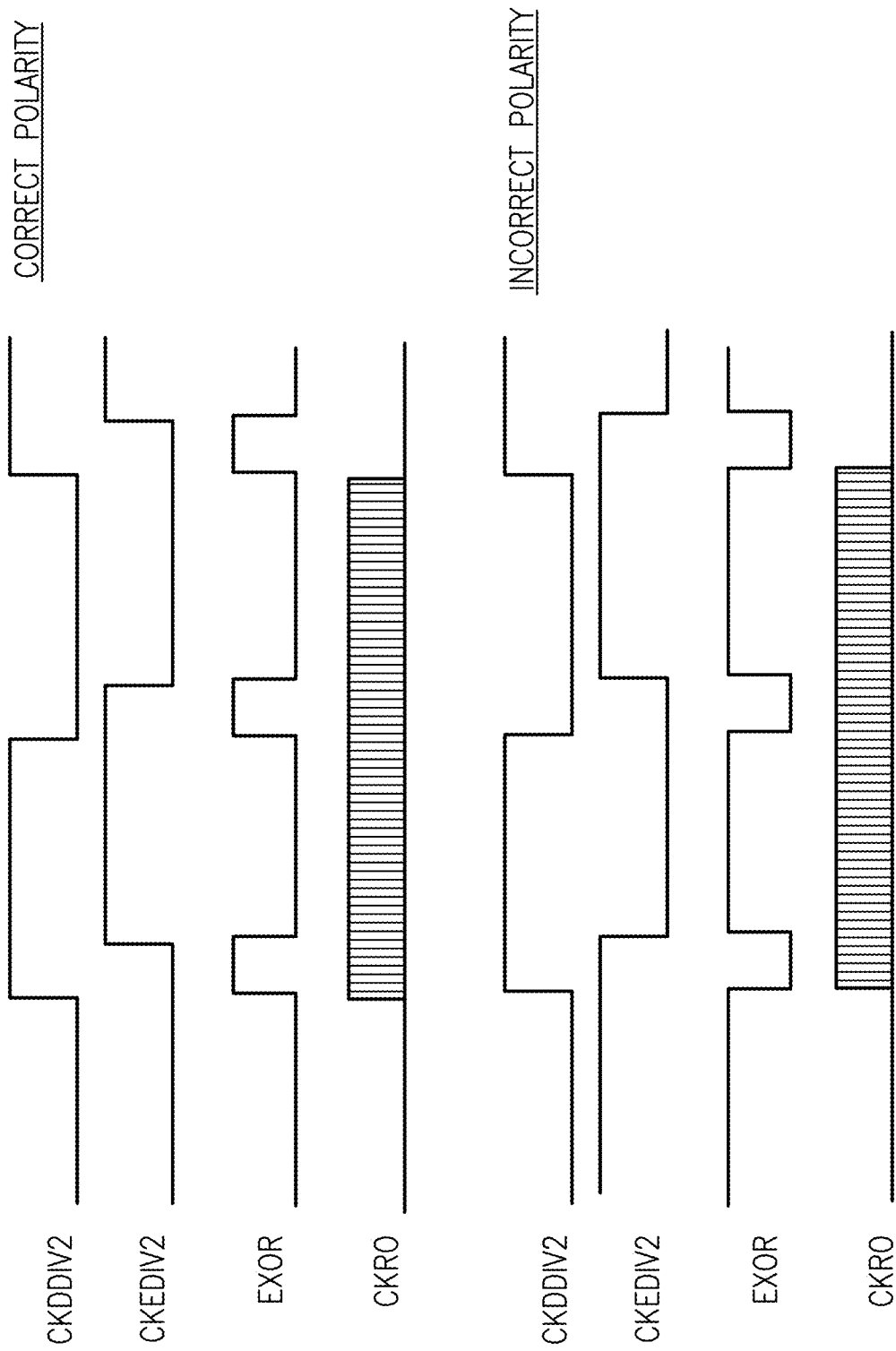
FIG. 3B is one example of a timing diagram for the asynchronous clock phasing detection circuit of FIG. 3A.

FIG. 3B is one example of a timing diagram for the asynchronous clock phasing detection circuit 60 of FIG. 3A. The timing diagram includes plots of the divided data clock signal CDDIV2, the divided edge clock signal CKEDIV2, the exclusive or signal EXOR, and the ring oscillator clock signal CKRO for both correct polarity of the dividers and for incorrect polarity of the dividers.

Figure 4:
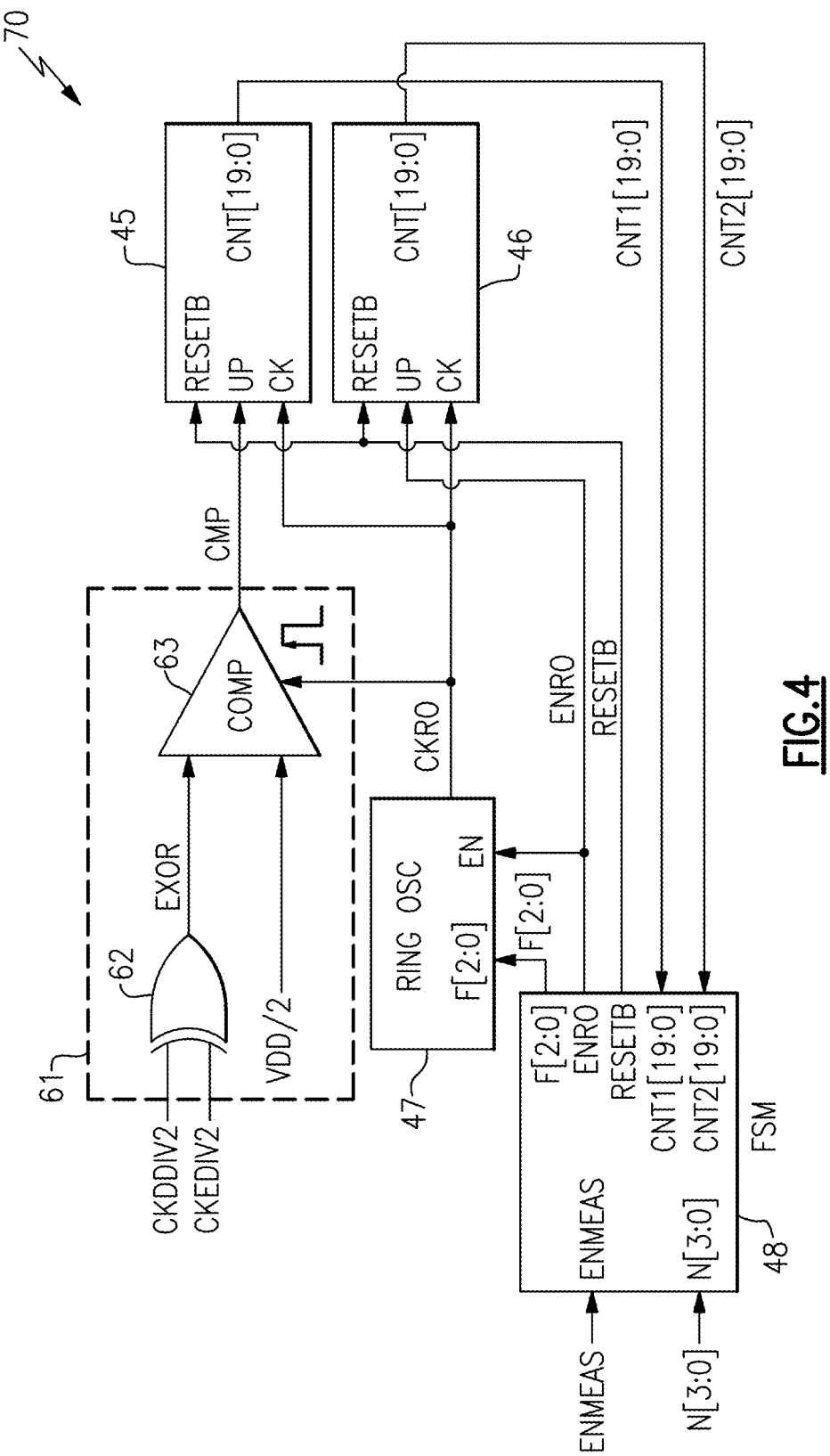
FIG. 4 is a schematic diagram of an asynchronous clock phasing detection circuit according to another embodiment.

FIG. 4 is a schematic diagram of an asynchronous clock phasing detection circuit 70 according to another embodiment. The asynchronous clock phasing detection circuit 70 includes a quantization and logic circuit 61, a first counter 45, a second counter 46, a ring oscillator 47, and an FSM 48.

The asynchronous clock phasing detection circuit 70 of FIG. 4 is similar to the asynchronous clock phasing detection circuit 60 of FIG. 3A, except that the asynchronous clock phasing detection circuit 70 includes a different implementation of the quantization and logic circuit. In particular, the quantization and logic circuit 61 of FIG. 4 includes an exclusive or gate 62 for generating an exclusive or signal EXOR based on performing an exclusive or operation of the first divided clock signal CKDDIV2 and the second divided clock signal CKEDIV2, and a comparator 63 clocked by the ring oscillator clock signal CKRO and operable to generate a comparison signal CMP by comparing the exclusive or signal EXOR to a threshold signal VDD/2.

Thus, the exclusive or operation occurs before quantization, in this embodiment.

In comparison to the asynchronous clock phasing detection circuit 60 of FIG. 3A, the asynchronous clock phasing detection circuit 70 advantageously operates with one fewer quantizer (implemented as a comparator, in this example). However, the exclusive or gate 62 of FIG. 4 operates on high frequency clock signals, and thus can generate large current surges and/or may output narrow pulses that can be squeezed and impact the measurement accuracy of the detection circuit 70. Moreover, since the exclusive or gate 62 operates on the first divided clock signal CKDDIV2 and the second divided clock signal CKEDIV2, large area clock routing and/or high power clock drivers may be needed for the clock signals, particularly for configurations in which the clock dividers are physically remote from one another and/or the quantization and logic circuit 61.

Figure 5A:
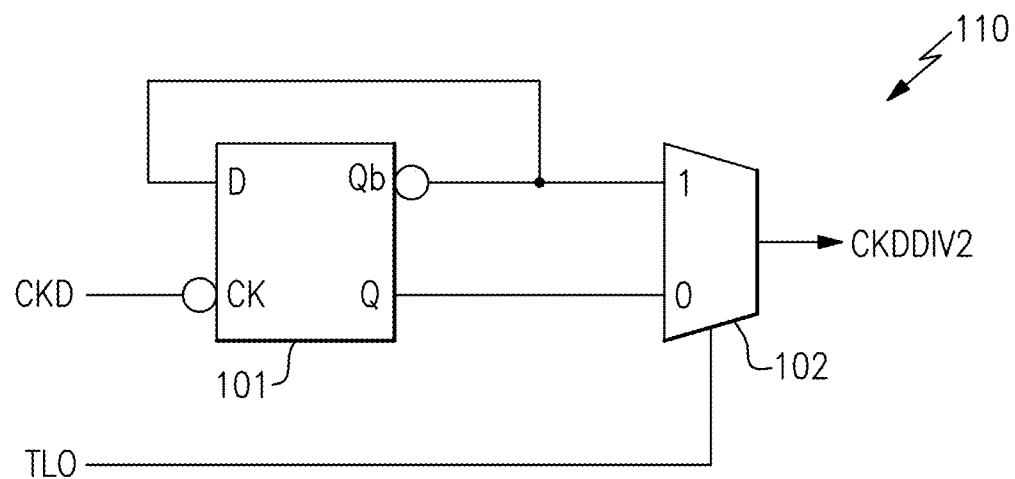
FIG. 5A is a schematic diagram of a data sampling clock divider according to one embodiment.

FIG. 5A is a schematic diagram of a data sampling clock divider 110 according to one embodiment. The data sampling clock divider 110 includes a flip-flop 101 and a multiplexer 102. The data sampling clock divider 110 illustrates one embodiment of the data sampling clock divider 5 of FIG. 1A.

The flip-flop 101 receives a data sampling clock signal CKD at a clock input CK, and outputs a data output signal at a data output Q and an inverted data output signal at an inverted data output QB. The data output signal and the inverted data output signal are provided as inputs to the multiplexer 102, while the inverted data output signal is also provided to a data input D of the flip-flop 101. The multiplexer 102 outputs a divided data clock signal CKDDIV2 based on selecting the inverted data output signal or the data output signal based on a state of a control signal TLO.

In certain implementations, the control signal TLO is tied low such that the state of the data sampling clock divider 110 is fixed.

Figure 5B:
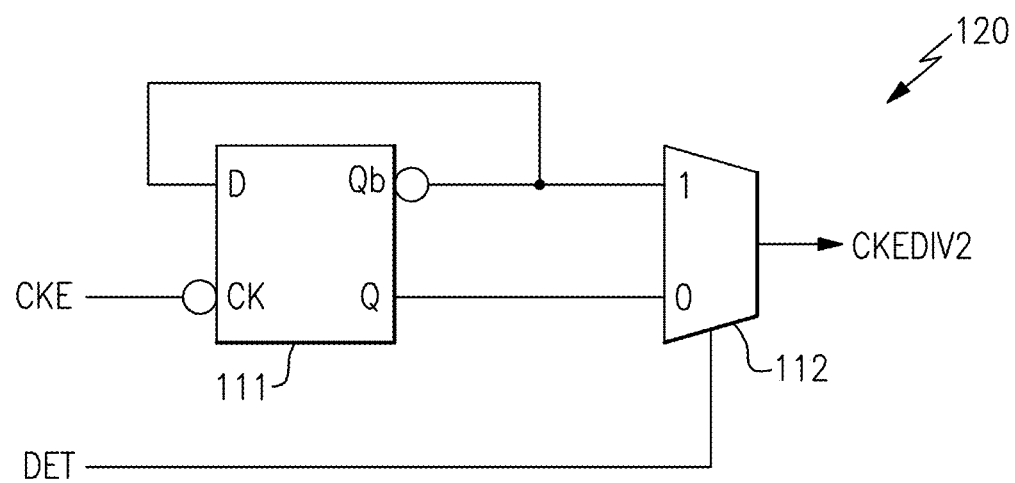
FIG. 5B is a schematic diagram of an edge sampling clock divider according to one embodiment.

FIG. 5B is a schematic diagram of an edge sampling clock divider 120 according to one embodiment. The edge sampling clock divider 120 includes a flip-flop 111 and a multiplexer 112. The edge sampling clock divider 120 illustrates one embodiment of the edge sampling clock divider 6 of FIG. 1A.

The flip-flop 111 receives an edge sampling clock signal CKE at a clock input CK, and outputs a data output signal at a data output Q and an inverted data output signal at an inverted data output QB. The data output signal and the inverted data output signal are provided as inputs to the multiplexer 112, while the inverted data output signal is also provided to a data input D of the flip-flop 111. The multiplexer 112 outputs a divided edge clock signal CKEDIV2 based on selecting the inverted data output signal or the data output signal based on a state of a detection signal DET outputted by an asynchronous clock phasing detection circuit.

Thus, an asynchronous clock phasing detection is used to correct divider state (and achieve proper timing between the divided edge clock signal CKEDIV2 and the divided data clock signal CKDDIV2). Although one example implementation of dividers and for correcting divider state is shown, other implementations are possible.

Figure 6A:
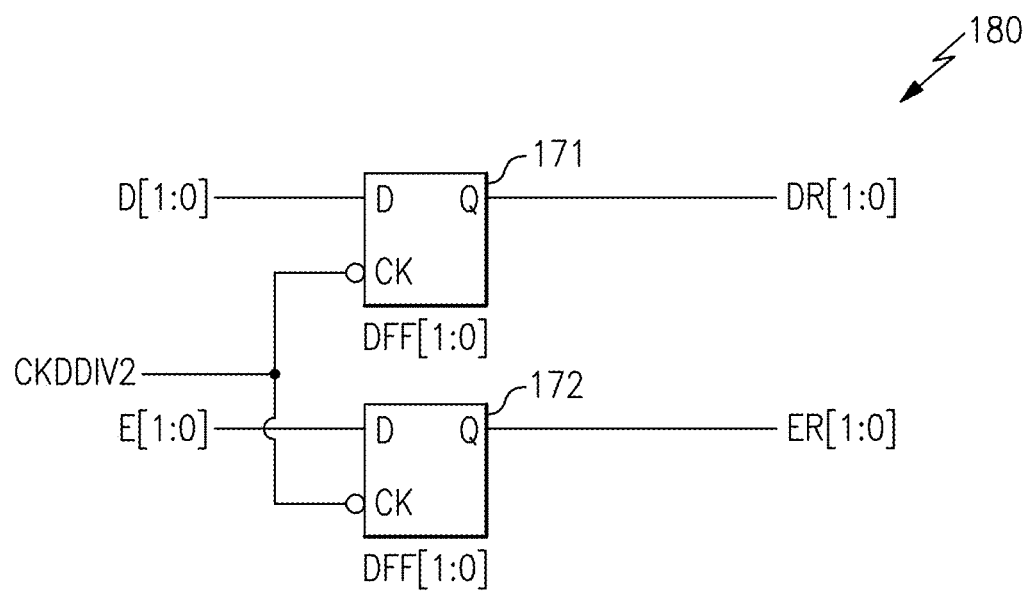
FIG. 6A is a schematic diagram of a retiming circuit according to one embodiment.

FIG. 6A is a schematic diagram of a retiming circuit 180 according to one embodiment. The retiming circuit 180 includes a pair of data flip-flops 171 and a pair of edge flip-flops 172. The retiming circuit 180 illustrates one embodiment of the retiming circuit 7 of FIG. 1A.

In the illustrated embodiment, each flip-flop of the retiming circuit 180 has a clock input CK that receives a divided data clock signal CKDDIV2. The pair of data flip-flops 171 retimes deserialized data samples D[1:0] to generate retimed data samples DR[1:0], while the pair of edge flip-flops 172 retimes deserialized edge samples E[1:0] to generate retimed edge samples ER[1:0].

Figure 6B:
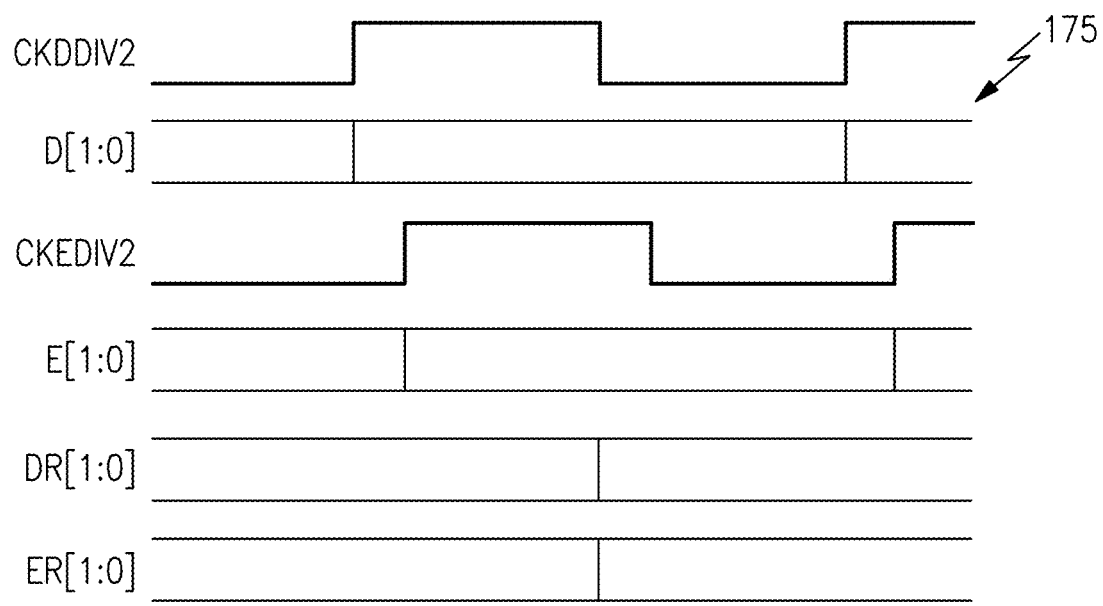
FIG. 6B is one example of a timing diagram for the retiming circuit of FIG. 6A.

FIG. 6B is one example of a timing diagram for the retiming circuit 180 of FIG. 6A. Example waveforms for the divided data clock signal CKDDIV2, the deserialized data samples D[1:0], the divided edge clock signal CKEDIV2, the deserialized edge samples E[1:0], the retimed data samples DR[1:0], and the retimed edge samples ER[1:0] are shown.

Figure 7A:
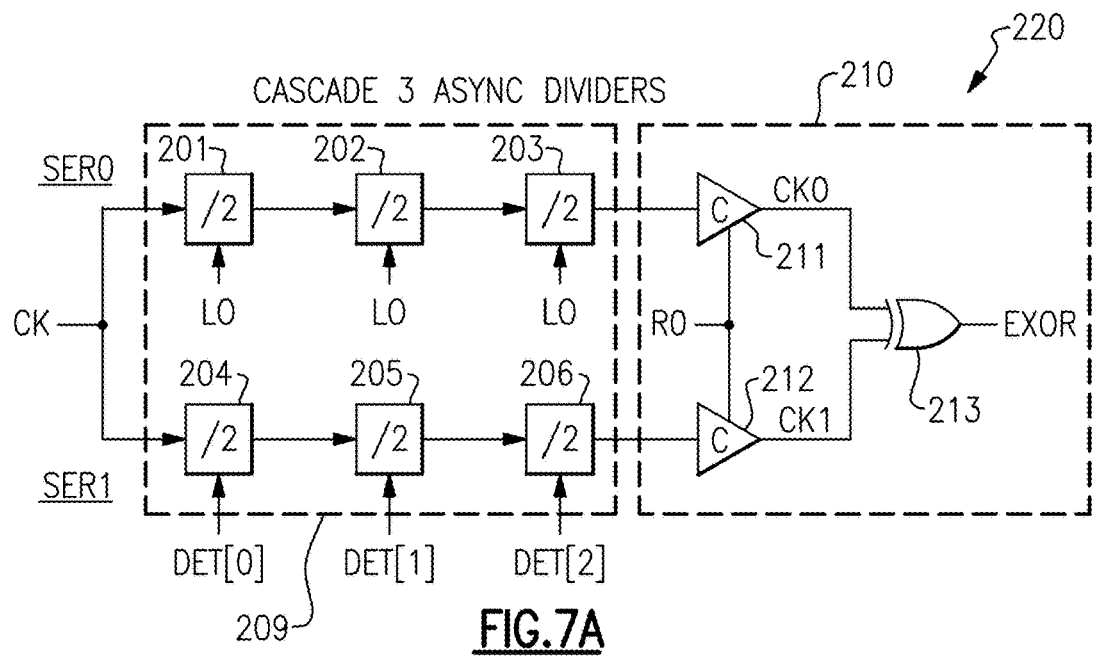
FIG. 7A is a schematic diagram of a clock dividing system according to another embodiment.
Figure 7B:
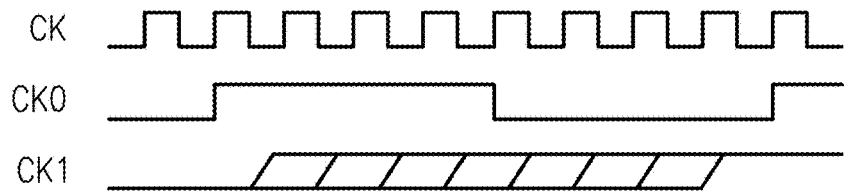
FIG. 7B is one example of a timing diagram for the clock dividing system of FIG. 7A.
Figure 7B:
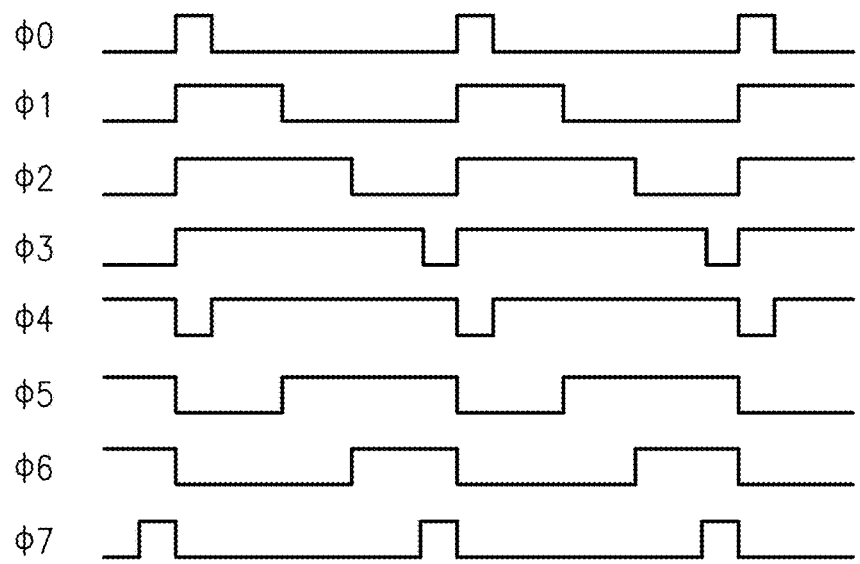

FIG. 7A is a schematic diagram of a clock dividing system 220 according to another embodiment. The clock dividing system 220 includes a pair of divide-by-eight dividers 209, and a quantization and logic circuit 210. FIG. 7B is one example of a timing diagram for the clock dividing system 220 of FIG. 7A.

The clock dividing system 220 illustrates an example application of the teachings herein for synchronizing a pair of divide-by-eight dividers 209, where each divide-by-eight divider is implemented as a cascade of three divide-by-two dividers. In particular, the pair of divide-by-dividers 209 includes a first divide-by-eight divider implemented by cascading divide-by-two dividers 201, 202, and 203, and a second divide-by-eight divider implemented by cascading divide-by-two dividers 204, 205, and 206. The quantization and logic circuit 210 includes a first comparator 211 controlled by a ring oscillator clock signal RO and that receives the output of the first divide-by-eight divider, and a second comparator 212 controlled by the ring oscillator clock signal RO and that receives the output of the second divide-by-eight divider. The quantization and logic circuit 210 further includes an exclusive or gate 213 for performing an exclusive or operation on a first divided clock signal CK0 from the first comparator 211 and a second divided clock signal CK1 from the second comparator 212 The exclusive or gate 213 generates an exclusive or signal EXOR. In another embodiment, the exclusive or gate 213 is omitted in favor of another type of logic gate, such a AND gate.

In certain embodiments, the pair of divide-by-dividers 209 are positioned physically close to a pair of quantizers (for example, comparators 211 and 212) to reduce timing constraints and enhance measurement accuracy of phasing detection.

Although not shown in FIG. 7A, the quantization and logic circuit 210 can be paired with other circuitry of an asynchronous clock phasing detection circuit, such as a first counter, a second counter, a ring oscillator, and a control circuit. For example, the embodiment of FIG. 7A can be implemented in accordance with any of the asynchronous clock phasing detection circuits disclosed herein.

An example application for the embodiment of FIG. 7A includes two serializers (SER0 and SER1) delivering divided word clock signals to main digital, in which it is desired for the divided word clock signals to be aligned to within a few UI.

If the divided word clocks, denoted as CK0 and CK1 and digital fabric are synchronized to within a few UI, the size of the first-in-first-out buffers (FIFOs) used to synchronize data at the next level can be reduced. As shown in FIG. 7B, the clock signals CK0 and CK1 have eight possible phase relationships, denoted $\varphi 0$, $\varphi 1$, $\varphi 2$, $\varphi 3$, $\varphi 4$, $\varphi 5$, $\varphi 6$, and $\varphi 7$. Thus, in this example, although a specific edge relationship between CK0 and CK1 is not critical, it is desirable for the edges to be close. In this example $\varphi 0$ and $\varphi 7$ are equivalent as far as lane synchronization is concerned, and are indistinguishable as far as the exclusive or operation is concerned.

In this example, at start-up, a measurement is taken to determine the phase relationship between CK0 and CK1 according to the ratio of the first counter to the second counter. Additionally, the value of the detection signals DET[0], DET[1], and DET[2] are controlled based on the ratio to thereby control the phase difference between CK0 and CK1. For example, if the measurement determines that operation is in $\varphi 3$ or $\varphi 4$, a bit vale of DET[2] could be flipped.

Figure 8A:
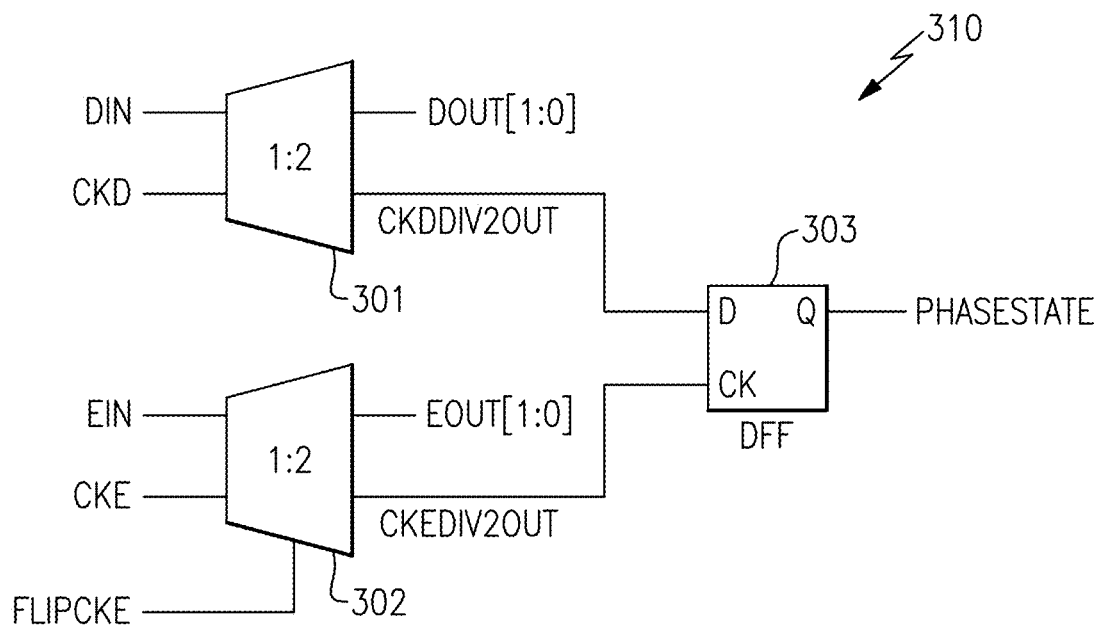
FIG. 8A is a schematic diagram of a prior art phasing detection circuit.
Figure 8B:
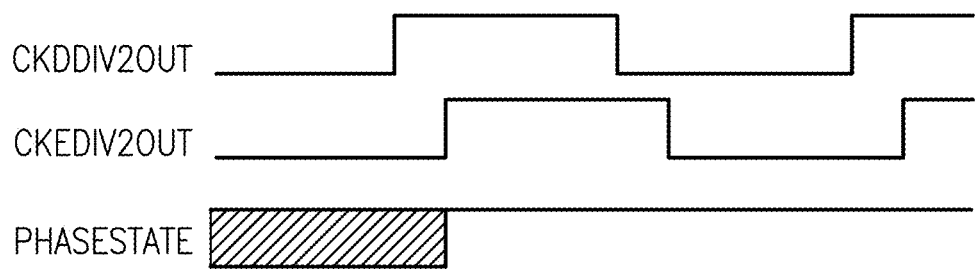
FIG. 8B is a timing diagram for the prior art phasing detection circuit of FIG. 8A.

FIG. 8A is a schematic diagram of a prior art phasing detection circuit 310. FIG. 8B is a timing diagram for the prior art phasing detection circuit 310 of FIG. 8A. The phasing detection circuit 310 includes a data deserializer 301, an edge deserializer 302, and a d-type flip-flop 303.

In FIG. 8A, the data deserializer 301 receives data samples DIN and a data sampling clock signal CKD, and outputs a divided (by 2) data clock signal CKDDIV2OUT and deserialized data samples DOUT[1:0]. Additionally, the edge deserializer 302 receives edge samples EIN and an edge sampling clock signal CKE, and outputs a divided (by 2) edge clock signal CKEDIV2OUT and deserialized edge samples EOUT[1:0]. The d-type flip-flop 303 includes a data input for receiving CKDDIV2OUT, a clock input for receiving CKEDIV2OUT, and an output for providing a phase state signal PHASESTATE. The edge deserializer 302 also receives a flip clock polarity signal FLIPCKE, for selectively flipping a polarity of the divided edge clock signal CKEDIV2OUT based on the phase state signal PHASESTATE.

Thus, if CKDDIV2OUT is HIGH on the rising edge of CKEDIV2OUT, the value of PHASESTATE is HIGH indicating the timing is correct.

At higher data rates such as 56 Gs/s, CKE may trail CKD by as few as 9 ps, which means that CKEDIV2OUT would trail CKDDIV2OUT by 9 ps. This circuit becomes a challenging circuit design and layout problem to meet setup and hold times on the d-type flip-flop 303.

Applications

Devices employing the above described schemes can be implemented into various electronic devices in a wide range of applications including, but not limited to, electronic timing systems such as clock and data recovery systems. Examples of electronic devices that can be implemented with an asynchronous clock phasing detection circuit include telecommunications systems, optical networks, and chip-to-chip communication.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A clock and data recovery (CDR) system comprising:
a first divider configured to output a first divided clock signal;
a second divider configured to output a second divided clock signal; and
an asynchronous clock phasing detection circuit comprising:
a comparison circuit configured to process the first divided clock signal and the second divided clock signal to generate an output signal indicating when the first divided clock signal and the second divided clock signal are in different states;
an oscillator configured to output a control clock signal;

a first counter controlled by the control clock signal and configured to count the output signal; and a control circuit configured to process a first count signal from the first counter to generate a detection signal indicating a relative phasing between the first divided clock signal and the second divided clock signal, wherein the detection signal is operable to control a state of at least one of the first divider or the second divider.

2. The CDR system of claim 1, further comprising a second counter configured to count a number of cycles of the control clock signal, the control circuit further configured to generate the detection signal based on ratio of the first count signal from the first counter and a second count signal from the second counter.

3. A clock and data recovery (CDR) system comprising:
a first divider configured to output a first divided clock signal;
a second divider configured to output a second divided clock signal; and
an asynchronous clock phasing detection circuit comprising:
a comparison circuit configured to process the first divided clock signal and the second divided clock signal to generate an output signal indicating when the first divided clock signal and the second divided clock signal are in different states;
an oscillator configured to output a control clock signal;
a first counter controlled by the control clock signal and configured to count the output signal; and
a control circuit configured to process a first count signal from the first counter to generate a detection signal indicating a relative phasing between the first divided clock signal and the second divided clock signal, wherein the control circuit is configured to control the oscillator to set an oscillation frequency of the control clock signal.

4. The CDR system of claim 3, wherein the first divided clock signal and the second divided clock signal have a clock period, the control circuit configured to control the oscillator to perform a random walk across the clock period.

5. The CDR system of claim 1, wherein the comparison circuit includes a first quantizer configured to generate a first quantized clock signal based on quantizing the first clock signal, a second quantizer configured to generate a second quantized clock signal based on quantizing the second clock signal, and a logic gate configured to generate the output signal based on the first quantized clock signal and the second quantized clock signal.

6. The CDR system of claim 5, wherein the first quantizer and the second quantizer are configured to receive the control clock signal from a pair of balanced clock signal routes.

7. The CDR system of claim 5, wherein the logic gate is an exclusive or gate.

8. The CDR system of claim 1, wherein the comparison circuit includes a logic gate configured to generate a logic signal based on the first clock signal and the second clock signal, and a quantizer configured to generate the output signal based on quantizing the logic signal.

9. The CDR system of claim 1, wherein the oscillator is a ring oscillator.

10. A method of asynchronous clock phasing detection, the method comprising:
dividing a first clock signal to generate a first divided clock signal using a first divider;
dividing a second clock signal to generate a second divided clock signal using a second divider;
generating an output signal indicating when the first divided clock signal and the second divided clock signal are in different states;
generating a first count signal by counting the output signal based on timing of a control clock signal using a first counter;
generating a detection signal indicating a relative phasing between the first divided clock signal and the second divided clock signal based on the first count signal;
generating a second count signal by counting a number of cycles of the control clock signal, and
generating the detection signal based on ratio of the first count signal and the second count signal.

11. The method of claim 10, wherein the first divided clock signal and the second divided clock signal have a clock period, the method further comprising varying a frequency of the control clock signal to perform a random walk across the clock period.

12. A method of asynchronous clock phasing detection, the method comprising:
dividing a first clock signal to generate a first divided clock signal using a first divider;
dividing a second clock signal to generate a second divided clock signal using a second divider;
genera tin output signal indicating when the first divided clock signal and the second divided clock signal are in different states;
generating a first count signal by counting the output signal based on timing of a control clock signal using a first counter;
generating a detection signal indicating a relative phasing between the first divided clock signal and the second divided clock signal based on the first count signal; and
controlling a state of at least one of the first divider or the second divider based on the detection signal.

13. An asynchronous clock phasing detection circuit comprising:
a comparison circuit configured to process a first divided clock signal and a second divided clock signal to generate an output signal indicating when the first divided clock signal and the second divided clock signal are in different states;
an oscillator configured to output a control clock signal;
a first counter controlled by the control clock signal and configured to count the output signal;
a control circuit configured to process a first count signal from the first counter to generate a detection signal indicating a relative phasing between the first divided clock signal and the second divided clock signal; and
a second counter configured to count a number of cycles of the control clock signal, the control circuit further configured to generate the detection signal based on ratio of the first count signal from the first counter and a second count signal from the second counter.

14. The asynchronous clock phasing detection circuit of claim 13, wherein the first divided clock signal and the second divided clock signal have a clock period, the control circuit configured to control the oscillator to perform a random walk across the clock period.

15. The asynchronous clock phasing detection circuit of claim 13, wherein the comparison circuit is configured to quantize the first divided clock signal to generate a first quantized clock signal, to quantize the second divided clock signal to generate a second quantized clock signal, and to generate the output signal based on a logical operation of the first quantized clock signal and the second quantized clock signal.

16. The asynchronous clock phasing detection circuit of claim 13, wherein the comparison circuit is configured to generate a logic signal based on a logical operation of the first divided clock signal and the second divided clock signal, and to generate the output signal based on quantizing the logic signal.

17. The asynchronous clock phasing detection circuit of claim 13, wherein the oscillator is a ring oscillator.

18. The method of claim 10, further comprising controlling the oscillator to set an oscillation frequency of the control clock signal.

19. The method of claim 12, further comprising controlling the oscillator to set an oscillation frequency of the control clock signal.

20. The method of claim 12, wherein the first divided clock signal and the second divided clock signal have a clock period, the method further comprising varying a frequency of the control clock signal to perform a random walk across the clock period.

* * * * *